United States Patent [19]

Yee

[11] Patent Number: 4,995,953

[45] Date of Patent: Feb. 26, 1991

[54] METHOD OF FORMING A SEMICONDUCTOR MEMBRANE USING AN ELECTROCHEMICAL ETCH-STOP

[75] Inventor: Renwin J. Yee, Mesa, Ariz.

[73] Assignee: Motorola, Inc., Schaumburg, Ill.

[21] Appl. No.: 428,580

[22] Filed: Oct. 30, 1989

[51] Int. Cl.⁵ .............................. C25F 3/12; C25F 3/14
[52] U.S. Cl. ............................... 204/129.3; 204/129.75
[58] Field of Search ............... 204/129.3, 129.65, 295, 204/129.75

[56] References Cited

U.S. PATENT DOCUMENTS

| | | | |
|---|---|---|---|
| 3,640,807 | 2/1972 | Van Dijk | 204/129.3 X |
| 3,853,650 | 12/1974 | Hartlaub | 204/129.3 X |
| 3,890,215 | 6/1975 | DiLorenzo et al. | 204/129.3 X |
| 4,054,497 | 10/1977 | Marshall | 204/129.3 X |
| 4,306,951 | 12/1981 | Depp et al. | 204/129.3 |
| 4,664,762 | 5/1987 | Hirata | 204/129.3 |
| 4,808,549 | 2/1989 | Mikkor et al. | 204/129.3 X |

OTHER PUBLICATIONS

Kloeck et al., "A Novel Four Electrode Electrochemical Etch-Stop Method for Silicon Membrane Formation," Transducers '87, Japan, pp. 116-119.
Kloeck et al., "Study of Electrochemical Etch-Stop for High Precision Thickness Control of Silicon Membranes", IEEE Transactions on Electron Devices, vol. 36, No. 4, Apr. 1989, pp. 663-669.

Primary Examiner—Donald R. Valentine
Attorney, Agent, or Firm—Joe E. Barbee; Miriam Jackson

[57] ABSTRACT

A semiconductor membrane is fabricated in a substrate by applying a voltage to a Schottky diode or a capacitor formed on a surface of the substrate to create a depletion region in the substrate. The substrate is exposed to an electrochemical, anisotropic etch solution. Etching terminates at the depletion region, thus forming a membrane having a thickness defined by the thickness of the depletion region.

18 Claims, 2 Drawing Sheets

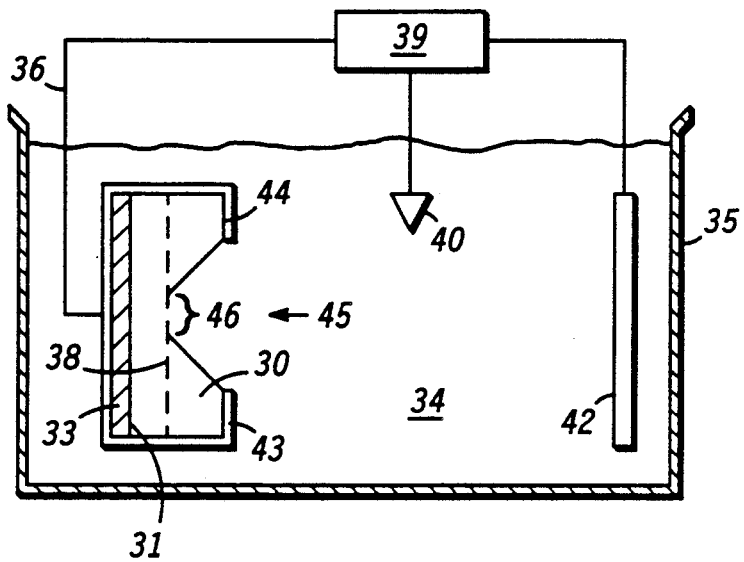
FIG. 3
FIG. 4
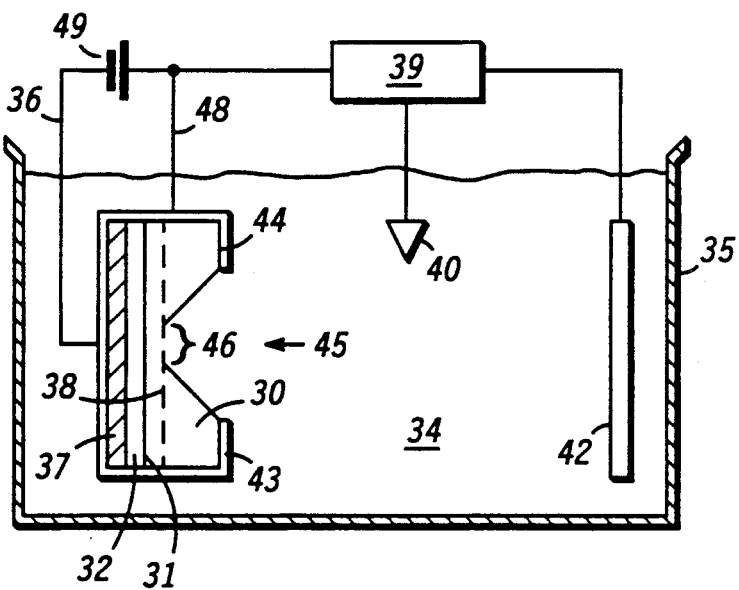

METHOD OF FORMING A SEMICONDUCTOR MEMBRANE USING AN ELECTROCHEMICAL ETCH-STOP

BACKGROUND OF THE INVENTION

This invention relates, in general, to the formation of a thin semiconductor layer or membrane, and more particularly, to the use of an electrochemical etch-stop for forming semiconductor membranes.

Semiconductor devices such as piezoresistive pressure sensors and accelerometers utilize a thin semiconductor layer, or membrane, as a sensing or active element. A piezoresistor is formed in the membrane, and the electrical signal of the piezoresistor varies with the deformation of the membrane. Thus, accurate reproducibility and control of the membrane thickness is necessary to improve device performance.

A method used in the past to form such membranes entails using a potassium hydroxide solution to etch a cavity in a portion of an N-type silicon substrate. The portion of the substrate not etched is masked off by a silicon nitride layer. The potassium hydroxide anisotropically etches the unmasked portion of the substrate. The substrate is etched until a desirable thickness of the membrane is achieved. However, one disadvantage of this process is that an unacceptable variation in the membrane thickness results due to the thickness across a substrate varying by approximately 2.5 microns. This variation is unacceptable for membranes of thicknesses less than 25 microns, because the variation across the wafer is high in comparison to the thickness of the membrane.

Thus, it would be desirable to to be able to form thin membranes more uniformly and accurately. Thin membranes are desirable for use in accelerometer devices. Accelerometers measure vibration or acceleration, therefore require a thin membrane in order to produce a signal large enough to measure. Thinner membranes are also desirable for pressure sensors in order to be able to reduce the membrane size and thus the pressure sensor die size.

Another method of forming a membrane entails the electrochemical etching of a reverse biased P-N junction. The P-N junction consists of an N-type epitaxial layer formed on a P-type substrate. This method is thoroughly discussed in an article by Ben Kloeck et al, entitled "A Novel Four Electrode Electrochemical Etch-Stop Method for Silicon Membrane Formation," published in Tranducers '87, Japan, pp. 116-119. The reverse biased P-N junction provides a large etching selectivity of P-type silicon over N-type silicon in anisotropic etchants. The etching terminates at the P-N junction, thus the thickness of the membrane is determined by the thickness of the N-type epitaxial layer. This N-type epitaxial layer still has a plus or minus 10% variation in thickness across the wafer. Thus, further improvement in the membrane thickness would be desirable. In addition, the cost of forming an epitaxial layer is approximately twice as much as the cost of a plain substrate wafer. Furthermore, if active elements are on the wafer with the membrane, the N-type epitaxial layer thickness, and thus the membrane thickness, is limited to a maximum of 15 microns because the maximum depth of a diffused P+ isolation region in an N-type epitaxial layer is approximately 15 microns. Thus, it would be desirable to be able to fabricate thin membranes on semiconductor substrates without using an epitaxial layer.

Accordingly, it is an object of the present invention to provide an improved method of forming a thin semiconductor layer or membrane.

Another object of the present invention is to provide an improved method of forming thin semiconductor membranes having a small variation in thickness across a substrate wafer.

A further object of the present invention is to provide a method of forming an improved accelerometer device.

Yet another object of the present invention is to provide a method of accurately forming a thin membrane in order to be able to shrink device die sizes.

SUMMARY OF THE INVENTION

In accordance with the present invention, the above and other objects and advantages are provided by a method of fabricating a semiconductor layer or membrane by applying a voltage to a first surface of a semiconductor substrate of a first conductivity type to create a depletion region which extends from the first surface into the semiconductor substrate. Subsequently, a second surface of the semiconductor substrate is exposed to an electrochemical, anisotropic etch solution, wherein etching terminates at the depletion region. Thus, a membrane having a thickness defined by the depletion region is formed.

BRIEF DESCRIPTION OF THE DRAWINGS

FIGS. 2 and 3 illustrate enlarged, cross-sectional views of a portion of a semiconductor substrate during various stages of fabrication of a membrane using a first embodiment of the present invention; and FIG. 4 illustrates an enlarged, cross-sectional view of a semiconductor substrate having a membrane formed therein by using a second embodiment of the present invention.

DETAILED DESCRIPTION OF THE DRAWINGS

Figure 1:
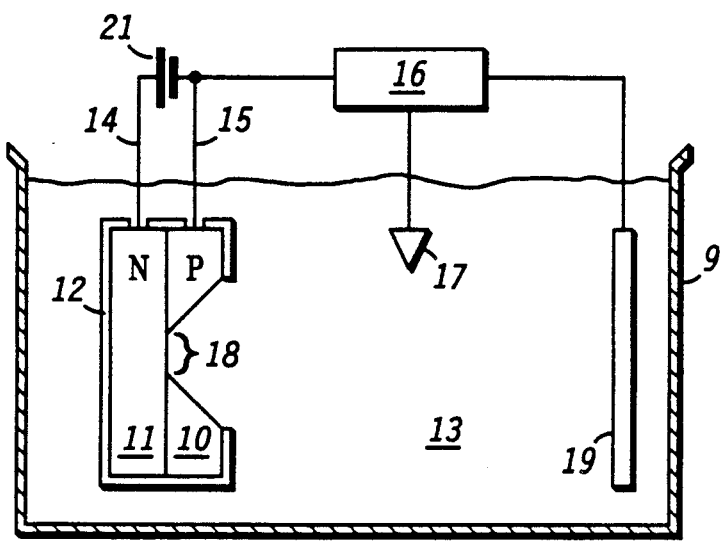
FIG. 1 illustrates an enlarged, cross-sectional view of a portion of a semiconductor wafer having a membrane formed therein by a prior art process.
Figure 2:
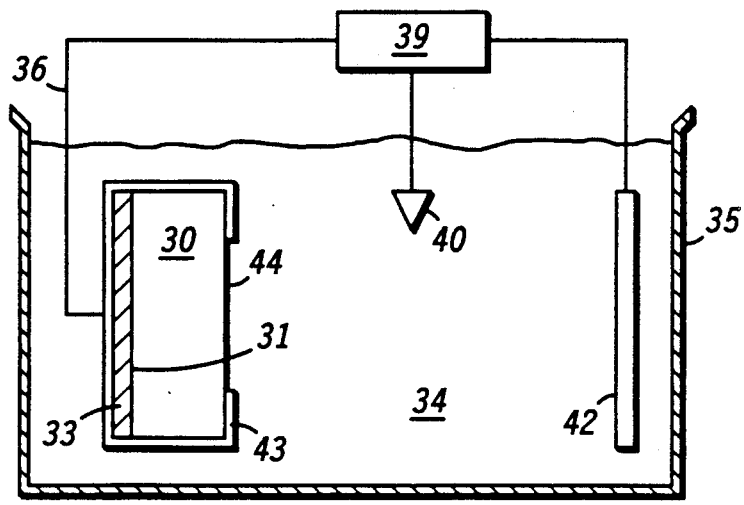

FIG. 1 illustrates a method of forming a semiconductor membrane using a prior art method of electrochemically etching membrane using a prior art a P-N junction. The P-N junction is formed by a P-type semiconductor substrate 10 having an N-type epitaxial layer 11 disposed thereon. The electrochemical etching is provided by a four electrode system: a voltage contact 14 to N-type epitaxial layer 11, a voltage contact 15 to semiconductor substrate 10, a standard calomel reference electrode 17, a counter-electrode 19, a potentiostat 16 used to control the potential of substrate 10 with respect to reference electrode 17, and a separate voltage supply 21. A portion of substrate 10 and epitaxial layer 11 are protected by a silicon dioxide or silicon nitride layer 12 before it is submerged into an etching solution of potassium hydroxide 13. Potassium hydroxide solution 13 is contained in a suitable container 9. It has been shown that etching terminates at the P-N junction, thus forming a membrane 18 having a thickness determined by the thickness of N-type epitaxial layer 11. Specific details of carrying out the process can be further found in an article entitled, "A Novel Four Electrode Electrochemical Etch-Stop Method for Silicon Membrane Formation," written by Ben Kloeck et al, published in Tranducers '87, Japan, pp. 116-119, which is hereby incorporated herein by reference. Referring now to FIGS. 2 and 3, which illustrate a first embodiment of the present invention. In the present invention, a membrane may be fabricated without using a substrate having an epitaxial layer. FIG. 2 illustrates a substrate 30, preferably an N-type silicon substrate, having a conductive layer 33 disposed on a first surface 31 of substrate 30. Substrate 30 and conductive layer 33 thus form a Schottky diode. Only a portion of substrate 30, one die, is illustrated in FIG. 2 for convenience. It should be understood that substrate 30 is usually comprised of many die. In one embodiment, conductive layer 33 is an aluminum layer, which is sputtered or deposited on first surface 31 of substrate 30. Before substrate 30 is etched, a mask 43 is disposed on substrate 30 and conductive layer 33 in order to protect that portion of substrate 30 from anisotropic etch solution 34. Mask 43 can be a silicon dioxide, a silicon nitride, or another material which is not etched by anisotropic etch solution 34. Mask 43 may be patterned on a second surface 44 of substrate 30 in order to provide for different etch patterns to produce either pressure sensor devices or accelerometers. Other means may be used to protect conductive layer 33, as long as an area of second surface 44 is exposed to an anisotropic etch solution 34. It may also be desirable to leave second surface 44 unmasked in order to form a thin semiconductor layer. Substrate 30 is submerged in anisotropic etch solution 34, which is contained in any suitable container 35. Anisotropic etchant 34 is preferably comprised of a solution of potassium hydroxide (KOH), of 15 to 60% concentration, but can be any anisotropic etchant of substrate 30, such as NaOH, LiOH, or ethylenediamine. The concentration may be higher, except that the etch rate of substrate 30 is diminished. Anisotropic etchant 34 is preferably heated to a temperature of 20 to 90° C. in order to optimize the etching rate of substrate 30. Electrical contact 36 is made to substrate 30 via conductive layer 33. In one example, electrochemical etching is accomplished by providing a three electrode system comprising a working electrode (substrate 30) contacted by electrical contact 36, a standard calomel reference electrode 40, a counter-electrode 42, and a potentiostat 39. A constant voltage is applied between conductive layer 30 and counter-electrode 42 such that the Schottky diode formed by conductive layer 33 and substrate 30 is reversed biased. Reference electrode 40 keeps a constant potential with respect to anisotropic etch solution 34.

FIG. 3 illustrates substrate 30 after etching has taken place. When substrate 30 is biased, a depletion layer forms, which is illustrated by dotted line 38 and extends from first surface 31 into substrate 30. Etching of substrate 30 forms a cavity 45 on second surface 44 of substrate 30. Applicant has discovered that depletion layer 38 creates an etch-stop; etching of substrate 30 terminates at depletion layer 38, thus creating a membrane 46 having a thickness determined by the thickness of depletion region 38. The thickness of depletion region 38 is dependent on the resistivity of substrate 30 and the amount of voltage applied. For example, if substrate 30 has a resistivity of approximately 40-60 ohm-cm, depletion region 38 could be approximately 20 microns from surface 31. Thus, suitable resistivities and voltages must be chosen to achieve the desirable thickness of membrane 46. A system utilizing only potentiostat 39, electrical contact 36 to conductive layer 33, the working electrode, and counter-electrode 42 will also produce an acceptable membrane 46, however, the three electrode system illustrated in FIGS. 2 and 3 is preferable.

FIG. 4 illustrates a second embodiment of the present invention. All elements of the second embodiment which are the same as the first embodiment are designated by the same numeral. The differences between the first and second embodiments are: an insulating layer 32 is disposed on first surface 31 of substrate 30, a gate layer 37 is disposed on insulating layer 32, a fourth electrode 48 is connected to substrate 30 and potentiostat 39, and a separate voltage supply 49 is added in order to maintain constant voltage across gate layer 37 and insulating layer 32 and to control the voltage between substrate 30 and etch solution 34. Gate layer 37 may be a conductive layer as in the first embodiment, however can also be a semiconductor such as polysilicon, silicon, or the like. In a preferred embodiment, insulating layer 32 is comprised of silicon dioxide, but can be comprised of other insulating materials. Substrate 30, insulating layer 32, and gate layer 37 form a capacitor. In a preferred embodiment, gate layer 37 is also an aluminum layer, thus forming an MOS capacitor. In this embodiment, the thickness of depletion layer 38 varies by the resistivity of substrate 30. Above a threshold voltage depletion region 38 remains constant for varying applied voltages, except if deep depletion is achieved. Deep depletion results when substrate 30 is biased and no holes are able to generate fast enough so depletion region 38 grows to compensate for the voltage applied. One way deep depletion can be obtained is by applying a saw tooth wave to substrate 30.

By now it should be appreciated that there has been provided an improved method of fabricating a semiconductor membrane accurately and reproducibly. Thin membranes can be fabricated by the present invention without using a P-N junction. A P-N junction is not necessary because it was discovered that etching terminates at a depletion region of a semiconductor material of one conductivity type.

I claim:

1. A method of forming a membrane, comprising the steps of:
   providing a semiconductor substrate of a first conductivity type, having a first and a second surface;
   providing a conductive layer on said first surface of said semiconductor substrate;
   applying a voltage to said conductive layer, thus creating a depletion region which extends from said first surface into said semiconductor substrate; and
   etching a portion of said second surface of said semiconductor substrate with an electrochemical, anisotropic etch solution, wherein etching terminates at said depletion region, thus forming said membrane having a thickness defined by said depletion region.

2. The method of claim 1 wherein said semiconductor substrate of said first conductivity type is an N-type silicon.

3. The method of claim 1 wherein said semiconductor substrate of said first conductivity type is a P-type silicon.

4. The method of claim 1 wherein said electrochemical, anisotropic etch solution is comprised of potassium hydroxide.

5. A method of forming a membrane, comprising the steps of:
  providing a semiconductor substrate of a first conductivity type, having a first and a second surface;
  providing a conductive layer on said first surface of said semiconductor substrate;
  providing an insulating layer between said first surface of said semiconductor substrate and said conductive layer;
  applying a voltage to said conductive layer, thus creating a depletion region which extends from said first surface into said semiconductor substrate; and
  etching a portion of said second surface of said semiconductor substrate with an electrochemical, anisotropic etch solution, wherein etching terminates at said depletion region, thus forming said membrane having a thickness defined by said depletion region.

6. The method of claim 5 wherein said insulating layer is comprised of a silicon dioxide layer.

7. A method of forming a membrane, comprising the steps of:
  providing a semiconductor substrate of a first conductivity type, having a first and a second surface;
  providing a Schottky diode on said first surface of said semiconductor substrate;
  providing an electrical contact to said Schottky diode;
  applying a voltage to said Schottky diode via said electrical contact, thus creating a depletion region which extends from said first surface into said semiconductor substrate; and
  etching a portion of said second surface of said semiconductor substrate with an electrochemical, anisotropic etch solution, wherein etching terminates at said depletion region, thus forming said membrane having a thickness defined by said depletion region.

8. A method of forming a membrane, comprising the steps of:
  providing a semiconductor substrate of a first conductivity having a first and a second surface, wherein said semiconductor substrate of said first conductivity type is an N-type silicon;
  providing a Schottky diode on said first surface of said semiconductor substrate;
  providing an electrical contact to said Schottky diode;
  applying a voltage to said Schottky diode via said electrical contact, thus creating a depletion region which extends from said first surface into said semiconductor substrate; and
  etching a portion of said second surface of said semiconductor substrate with an electrochemical, anisotropic etch solution, wherein etching terminates at said depletion region, thus forming said membrane having a thickness defined by said depletion region.

9. A method of forming a membrane, comprising the steps of:
  providing a semiconductor substrate of a first conductivity having a first and a second surface, wherein said semiconductor substrate of said first conductivity type is a P-type silicon;
  providing a Schottky diode on said first surface of said semiconductor substrate;
  providing an electrical contact to said Schottky diode;
  applying a voltage to said Schottky diode via said electrical contact, thus creating a depletion region which extends from said first surface into said semiconductor substrate; and
  etching a portion of said second surface of said semiconductor substrate with an electrochemical, anisotropic etch solution, wherein etching terminates at said depletion region, thus forming said membrane having a thickness defined by said depletion region.

10. A method of forming a membrane, comprising the steps of:
  providing a semiconductor substrate of a first conductivity having a first and a second surface;
  providing a Schottky diode on said first surface of said semiconductor substrate;
  providing an electrical contact to said Schottky diode;
  applying a voltage to said Schottky diode via said electrical contact, thus creating a depletion region which extends from said first surface into said semiconductor substrate; and
  etching a portion of said second surface of said semiconductor substrate with an electrochemical, anisotropic etch solution, wherein etching terminates at said depletion region, thus forming said membrane having a thickness defined by said depletion region, and wherein said electrochemical anisotropic etch solution is comprised of potassium hydroxide.

11. A method of forming a membrane, comprising the steps of:
  providing a semiconductor substrate of a first conductivity having a first and a second surface;
  providing a Schottky diode on said first surface of said semiconductor substrate;
  providing an electrical contact to said Schottky diode;
  applying a voltage to said Schottky diode via said electrical contact, thus creating a depletion region which extends from said first surface into said semiconductor substrate; and
  etching a portion of said second surface of said semiconductor substrate with an electrochemical, anisotropic etch solution, wherein etching terminates at said depletion region, thus forming said membrane having a thickness defined by said depletion region, and wherein said electrochemical etch is comprised of a counter-electrode and a reference electrode which provide for a predetermined voltage across said semiconductor substrate and said etch solution.

12. A method of forming a membrane, comprising the steps of:
  providing a semiconductor substrate of a first conductivity type, having a first and a second surface;
  providing a dielectric layer on said first surface of said semiconductor substrate;
  providing a gate layer on said dielectric layer;
  providing a first electrical contact to said gate layer;
  applying a voltage to said gate layer via said first electrical contact, thus creating a depletion region which extends from said first surface into said semiconductor substrate; and
  etching a portion of said second surface of said semiconductor substrate with an electrochemical, anisotropic etch solution, wherein etching terminates at said depletion region, thus forming said membrane having a thickness defined by said depletion region.

13. The method of claim 12 wherein said semiconductor substrate of said first conductivity type is an N-type silicon.

14. The method of claim 12 wherein said semiconductor substrate of said first conductivity type is a P-type silicon.

15. The method of claim 12 wherein said electrochemical, anisotropic etch solution is comprised of potassium hydroxide.

16. The method of claim 12 further comprising the step of providing a second electrical contact to said semiconductor substrate.

17. The method of claim 12 wherein said electrochemical etch is comprised of a counter-electrode and a reference electrode which provide for a predetermined voltage across said semiconductor substrate and said etchant.

18. A method of etching a semiconductor material, comprising:
    providing a semiconductor substrate of one conductivity type;
    generating a depletion layer of a predetermined depth in said semiconductor substrate; and
    etching into said semiconductor substrate from one surface thereof, wherein said depletion layer serves as an etch stop.

* * * * *